United States Patent
Muramatsu et al.

(10) Patent No.: US 6,444,494 B1
(45) Date of Patent: Sep. 3, 2002

(54) PROCESS OF PACKAGING A SEMICONDUCTOR DEVICE WITH REINFORCED FILM SUBSTRATE

(75) Inventors: Shigetsugu Muramatsu; Takashi Kurihara, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/412,976

(22) Filed: Oct. 6, 1999

(30) Foreign Application Priority Data

Oct. 7, 1998 (JP) .......................................... 10-285088
Jan. 21, 1999 (JP) ............................................ 11-12737

(51) Int. Cl.⁷ .............................................. H01L 21/48
(52) U.S. Cl. ....................................... 438/110; 438/124
(58) Field of Search ................................ 438/106, 110, 438/111, 112, 113, 118, 121, 122, 123, 124, 125, 126, 127, 460, 461, 462, 464; 257/668, 676

(56) References Cited

U.S. PATENT DOCUMENTS

| | | | |
|---|---|---|---|
| 4,079,511 A | * | 3/1978 | Grabbe |
| 5,041,395 A | * | 8/1991 | Steffen |
| 5,384,689 A | | 1/1995 | Shen |
| 5,661,086 A | * | 8/1997 | Nakashima et al. |
| 5,767,528 A | | 6/1998 | Sumi et al. |
| 5,951,804 A | | 9/1999 | Kweon et al. |
| 6,020,221 A | * | 2/2000 | Lim et al. |
| 6,066,512 A | * | 5/2000 | Hashimoto |
| 6,074,898 A | * | 6/2000 | Ohsawa et al. |
| 6,093,970 A | * | 7/2000 | Ohsawa et al. |
| 6,214,641 B1 | * | 4/2001 | Akram |
| 6,249,046 B1 | * | 6/2001 | Hashimoto |

FOREIGN PATENT DOCUMENTS

| | | | |
|---|---|---|---|
| JP | 9-129685 | * | 5/1997 |
| JP | 10-064952 | | 6/1998 |
| JP | 10-209224 | | 7/1998 |

* cited by examiner

Primary Examiner—Michael Sherry
Assistant Examiner—Evan Pert
(74) Attorney, Agent, or Firm—Staas & Halsey LLP

(57) ABSTRACT

Semiconductor devices are manufactured, using film substrates, as follows. Individual film substrates are separated from a film substrate tape having a plurality of film substrates continuously and integrally connected to each other, each the film substrate comprising a base film having first and second surfaces, a circuit pattern being formed on the first surface and a mounting section being formed on the second surface. The base film has an opening to which electrode terminals of a semiconductor element are exposed when the semiconductor element is mounted. The individual film substrates are adhered to respective reinforcement members of a reinforcement frame, which has a plurality of the reinforcement members continuously and integrally connected to each other. Each reinforcement member has an accommodation hole for accommodating the semiconductor element, so that the semiconductor element mount section is exposed in the accommodation hole. A semiconductor element is mounted on the film substrate by adhering an electrode terminal-forming surface of the semiconductor element to said mounting section so that electrode terminals of the semiconductor element are exposed in the accommodation hole. The electrode terminals exposed in the opening are electrically connected to the circuit patterns. The opening is sealed with resin and then the individual reinforcement members are separated from the reinforcement frame.

11 Claims, 8 Drawing Sheets

PROCESS OF PACKAGING A SEMICONDUCTOR DEVICE WITH REINFORCED FILM SUBSTRATE

BACKGROUND OF THE INVENTION

1. Field of the Invention

The present invention relates to a process for manufacturing a semiconductor device and, particularly to a process for manufacturing a semiconductor device wherein a film substrate is adhered to an electrode-forming surface of a semiconductor chip.

2. Description of the Related Art

FIG. 11 illustrates one example of a so-called chip-size package formed by adhering a film substrate 12 onto an electrode terminal-forming surface of a semiconductor surface of a semiconductor chip 10. The film substrate 12 has a circuit pattern 16 with lands on one side surface of an electrically-insulating base film 14 of polyimide or others, and carries an adhesive layer 18 on the other surface to be adhered onto the electrode terminal-forming surface of the semiconductor chip 10. The semiconductor device illustrated in FIG. 11 carries the semiconductor chip 10 provided with two rows of electrodes 20 arranged in the lengthwise direction in a generally central region of the electrode terminal-forming surface thereof. An opening for a wire-bonding operation is formed at a center of the film substrate 12, through which the electrode terminals 20 are connected to bonding parts 22 of the circuit pattern 16 via bonding wires 24. Reference numeral 26 denotes an external connection terminal bonded to the land of the circuit pattern 16, and 28 denotes a shield resin for shielding the bonded portion.

Reduction in size of the semiconductor chip 10 is a recent trend for the purpose of increasing the number thereof obtainable from one wafer, which in turn results in the difficulty in arranging external connection terminals within a space corresponding to the electrode terminal-forming surface of the minimized semiconductor chip 10, because a circuit board on which the semiconductor device is mounted or an external connection terminal, such as a solder ball, still adopts the conventional mounting method.

Therefore, as shown in FIG. 12, there might be a case wherein the film substrate 12 on which the external connection terminals are arranged becomes larger than the minimized semiconductor chip 10. If the semiconductor chip 10 is smaller than the film substrate 12 as described above, the peripheral region (designated as "A" in the drawing) of an area defined on a surface of the film substrate 12 could not be supported by the semiconductor chip 10, which requires taking some measures for the reinforcement of the peripheral region of the film substrate 12.

FIGS. 13(a) to 13(c) show the prior art steps for manufacturing the semiconductor device in which the semiconductor chip 10 is smaller in size than the film substrate 12.

FIG. 13(a) illustrates a rectangular film substrate tape 120 cut off from a long-sized film substrate tape in which a plurality of film substrates are consecutively arranged. The film substrate tape 120 is divided into sections having the same circuit pattern 16, for mounting the semiconductor chips 10, respectively. Each of the sections has a bonding opening 15 extending in the longitudinal direction in the middle portion thereof.

FIG. 13(b) illustrates the film substrate tape 120 secured onto a carrier frame 30 for assuredly carrying out various steps for the manufacturing, such as mounting of semiconductor chip, wire-bonding or shielding. The carrier frame 30 is made of a metallic sheet or the like into a frame shape, and serves to support the periphery of the film substrate tape.

Then, a reinforcement member 32 is bonded to the peripheral region of the respective section on a side of the film substrate 12 to which the semiconductor chip 10 is to be adhered (a side opposite to that carrying the circuit pattern) (see FIG. 13(c)). The reinforcement member 32 is of a frame shape formed in conformity with the contour of the film substrate 12 and a size of the semiconductor chip 10. The reinforcement member 32 is made of a resinous material having a high shape-retaining ability such as a polyimide tape or a thin metallic plate. The reinforcement member 32 is formed separately from the film substrate tape 120 and the carrier frame 30, and is individually adhered to the film substrate tape 12 by an adhesive layer 18 provided on the film substrate tape 120.

After the reinforcement member 32 has been adhered to the respective film substrate 12 of the film substrate tape 120, the semiconductor chip 10 is adhered. Thereafter, a bonding part 22 of the circuit pattern 16 is wire-bonded to an electrode terminal 20 of the semiconductor chip through the opening of the film substrate 12. After exposed portions of the bonding parts 22 or others have been resin-shielded and the external connection terminals have been bonded to the lands of the circuit pattern, the respective film substrates 12 are cut into sections from the film substrate tape 120 to result in individual semiconductor devices.

FIGS. 14(a) and 14(b) are a side sectional view and a bottom view, respectively, of the semiconductor device thus obtained. As apparent therefrom, the outer peripheral region of the film substrate 12 is strengthened with the reinforcement member 32 adhered to the side of the former on which the semiconductor chip 10 is mounted.

The prior art process for manufacturing the semiconductor device described above includes the steps of supporting the film substrate tape 120 by the carrier frame 30, and adhering the reinforcement member 32 to the film substrate tape 120. Such a manufacturing process has drawbacks in that a material cost is expensive and the manufacturing steps are complicated because the semiconductor device is formed by combining the film substrate tape 120, the carrier frame 30 and the reinforcement member with each other.

SUMMARY OF THE INVENTION

An object of the present invention is to provide a process for easily manufacturing a semiconductor device of a good quality by improving the prior art manufacturing process so that the manufacturing steps are simplified to reduce the manufacturing cost.

According to the present invention, there is provided with a process for manufacturing a semiconductor device, the process comprising the following steps of: separating individual film substrates from a film substrate tape having a plurality of film substrates continuously and integrally connected to each other, each film substrate comprising a base film having first and second surfaces, a circuit pattern being formed on the first surface and a semiconductor element mounting section being formed on the second surface, the base film having an opening to which electrode terminals of a semiconductor element are exposed when the semiconductor element is mounted; adhering the individual film substrates to respective reinforcement members of a reinforcement frame having a plurality of the reinforcement members continuously and integrally connected to each other, each reinforcement member having an accommodation hole for accommodating the semiconductor element, so that the semiconductor element mount section is exposed in the accommodation hole; mounting the semiconductor element on the film substrate by adhering an electrode terminal-forming surface of the semiconductor element to said mounting section so that electrode terminals of the semiconductor element are exposed in the accommodation hole; electrically connecting the electrode terminals exposed in the opening to the circuit patterns; sealing the opening with resin; and separating the individual reinforcement members from the reinforcement frame.

The electrode terminals of the semiconductor element can be electrically connected to the circuit patterns by wire-bonding.

The film substrate is such that tip ends of the circuit pattern extend into the opening as lead portions.

The reinforcement frame may comprise a frame base and the plurality of reinforcement members suspended by the frame base. The reinforcement frame may be a metallic reinforcement frame.

According to another aspect of the present invention, there is provided a process for manufacturing a semiconductor device, the process comprising the following steps of: separating individual film substrates from a film substrate tape having a plurality of the film substrates continuously and integrally connected to each other, each the film substrate comprising a base film having first and second surfaces, a circuit pattern being formed on the first surface and an mounting section being formed on the second surface, the mounting section provided with connecting terminals connected to the circuit patterns by means of vias; adhering the individual film substrates to respective reinforcement members of a reinforcement frame having a plurality of the reinforcement members continuously and integrally connected to each other, each the reinforcement member having an accommodation hole for accommodating a semiconductor element, so that the mount section is exposed in the accommodation hole; mounting the semiconductor element on the film substrate by flip-chip electrically connecting the electrode terminals of the semiconductor element to the connecting terminals; and separating the individual reinforcement members from the reinforcement frame.

DETAILED DESCRIPTION OF THE EMBODIMENTS

The preferred embodiments of the present invention will now be described in detail below with reference to the attached drawings.

Figure 1:
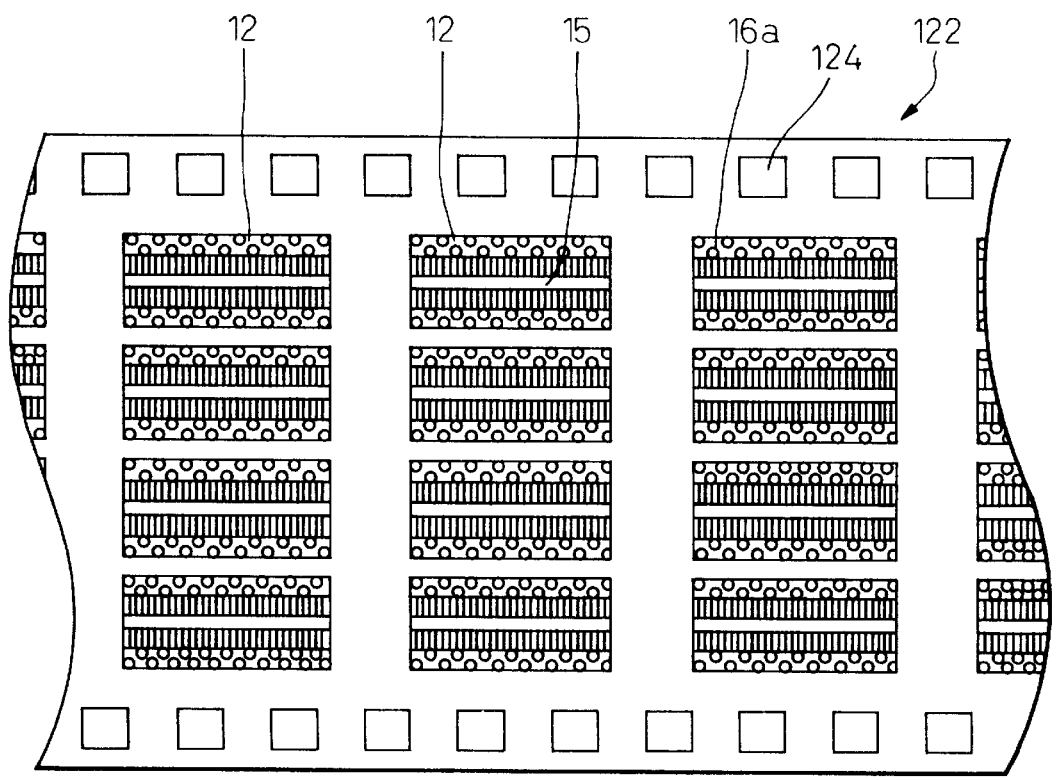
FIG. 1 is a plan view of one embodiment of a film substrate used for the manufacturing of a semiconductor device.

FIG. 1 illustrates a film substrate tape 122, on which are consecutively and integrally arranged a number of film substrates 12, each to be adhered to an electrode terminal-forming surface of a semiconductor chip 10. The film substrate 12 formed on the film substrate tape 122 while dividing the latter into sections at a predetermined interval has the same structure as that of the prior art film substrate 12 described hereinabove; that is, a circuit pattern 16 is formed on one side of a base film 14, while a mounting area is defined on the other side of the base film 14, for mounting the semiconductor chip 10. A slit-like opening 15 is provided for the wire-bonding, and lands 16a are provided to be connected to external connection terminals. The surface of the film substrate 12 is covered with a protective layer made, for example, of solder resist, except for the exposed part such as lands 16a or bonding parts 22.

When the film tape 122 is produced, a long-sized tape consisting of the base film 14 clad on one side thereof with a copper foil is first punched to have sprocket holes 124. Then, a photosensitive resist is coated on the surface of the copper foil to form a resist layer which is exposed and developed in conformity with the predetermined circuit patterns 16 including the bonding parts 22 and the lands 16a to form resist patterns which in turn are used as a mask for etching the copper foil to form the circuit patterns 16. After the resist patterns have been removed, the surface of the base film 14 on which the circuit patterns 16 are formed is coated with a protective layer such as solder resist except for part to be exposed outside such as the bonding portions which are then applied with a protective plating of gold or the like. Finally, an adhesive layer is provided on the other surface of the base film 14, and the openings 15 are formed by a perforation process to result in the film base tape 122.

Figure 2:
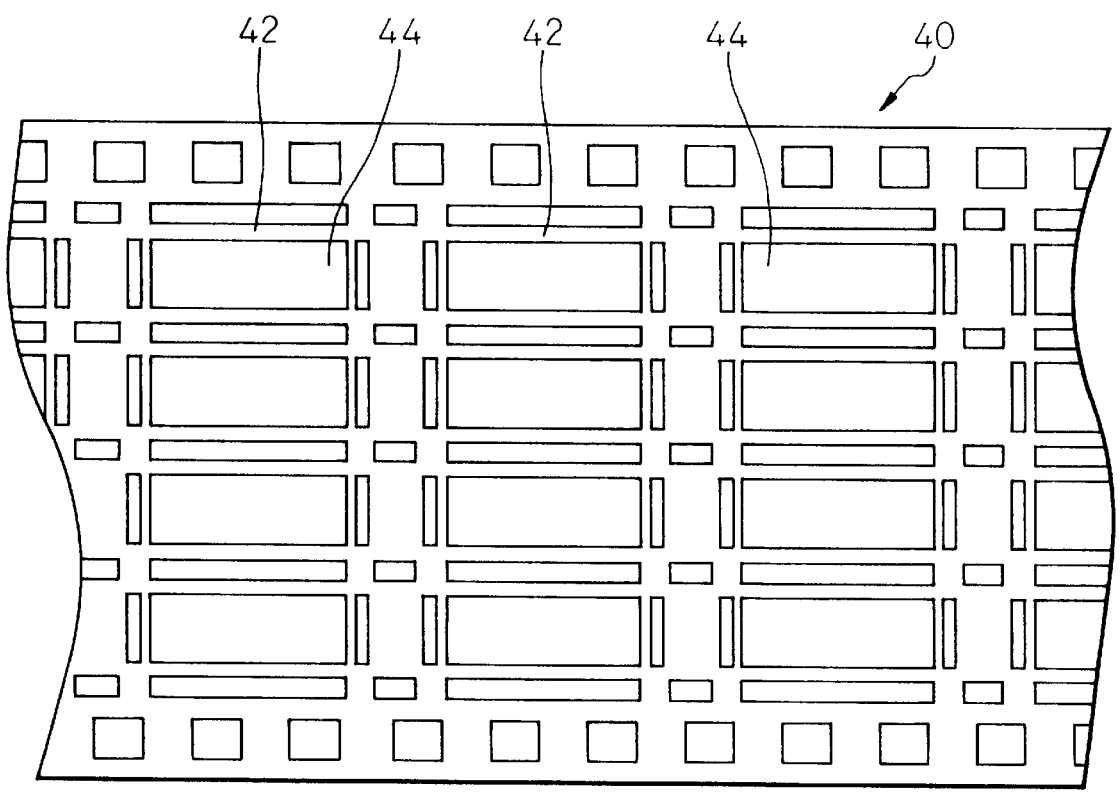
FIG. 2 is a plan view of one embodiment of a reinforcement frame used for the manufacturing of a semiconductor device.

FIG. 2 illustrates a reinforcement frame 40 to be adhered to the film substrates 12. The reinforcement frame 40 is used as a carrier frame for supporting the film substrates 12 and the semiconductor chips 10 mounted onto the film substrates 12, and also provides the semiconductor device with a reinforcement member 32 (FIG. 7) for strengthening the film substrate 12.

That is, the reinforcement frame 40 is formed of the same material as that of the reinforcement member 32 to have an elongated rectangular shape wherein reinforcement members 42, each having a rectangular frame shape in conformity with the shape of the reinforcement member 32 for the semiconductor device, are consecutively aligned to each other. The respective reinforcement member 42 has an accommodation hole 44 for accommodating the semiconductor chip 10.

The reinforcement frame 40 illustrated is formed of a thin sheet of stainless steel by a pressing work to impart the latter with a shape wherein the reinforcement members 42 are consecutively aligned. In the illustrated embodiment, the reinforcement member 42 is suspended from the frame solely by corners thereof for the purpose of enhancing the severance/separation of the reinforcement member 42 from the frame. Of course, instead of suspending the reinforcement member 42 by the corners thereof, it is possible to suspend the same by intermediate regions of the respective side. Also, it is possible to solely provide the accommodation holes 44 in the stainless sheet for accommodating the semiconductor chips 10, which is then punched along the contour of the reinforcement members 32 to result in individual semiconductor devices.

Figure 3:
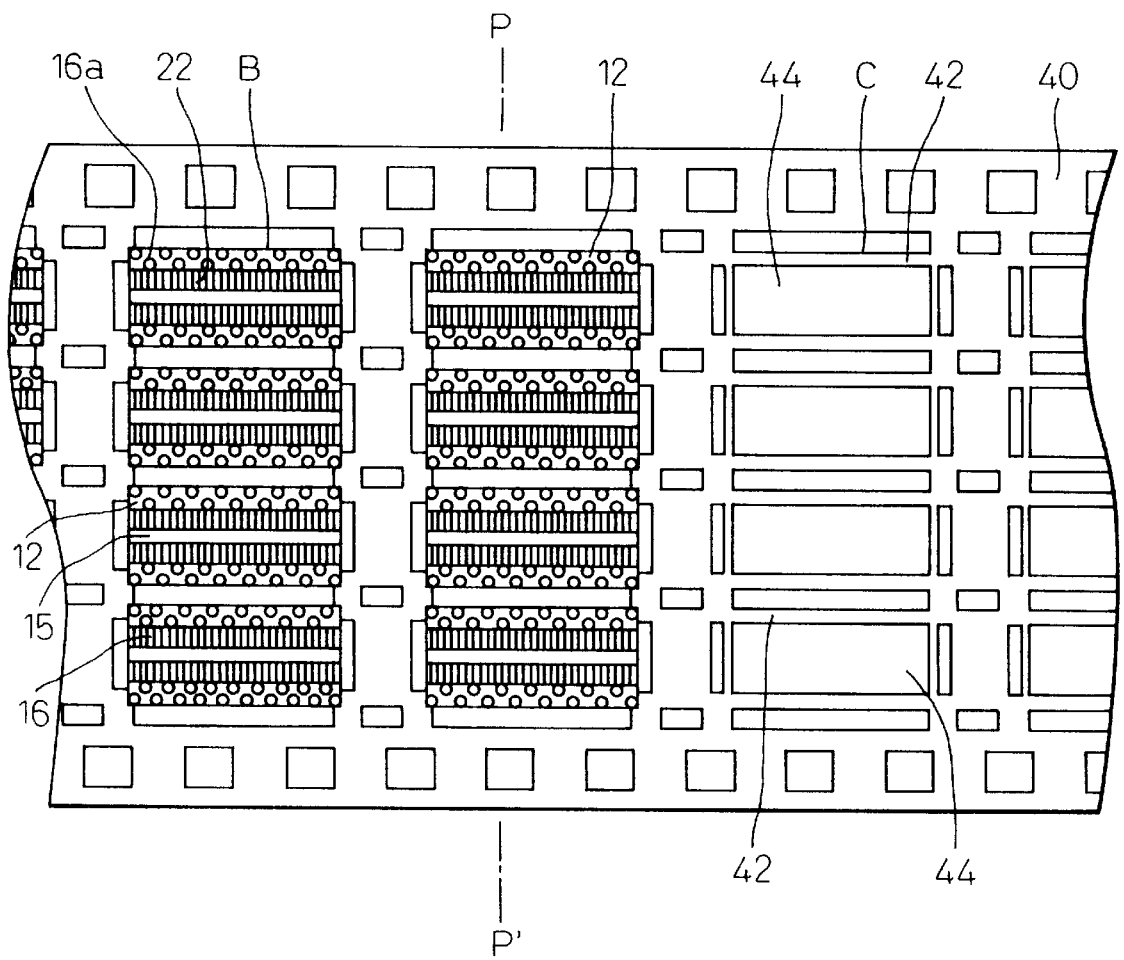
FIG. 3 is a plan view of individual film substrates adhered to the reinforcement frame.

FIG. 3 shows a the reinforcement frame 40, to which the film substrates 12 individually separated from the film substrate tape 122 are adhered. B represents a region in which the film substrate 12 has been adhered, while C represents a region in which the film substrate 12 is not adhered. When the individual film substrate 12 is adhered to the reinforcement frame 40, the film substrate 12 is first cut off from the film substrate tape 122 and then registered with the reinforcement member 42 of the reinforcement frame 40 while holding the former by suction or the like. Instead of providing an adhesive layer 18 (FIG. 4) in advance on the film substrate 12, the adhesive layer 18 may be preliminarily formed on the reinforcement frame 40 to adhere the film substrate 12. The adhesive layer 18 may be provided solely in a region of the reinforcement member 42 or all over the reinforcement frame 40.

Figure 4:
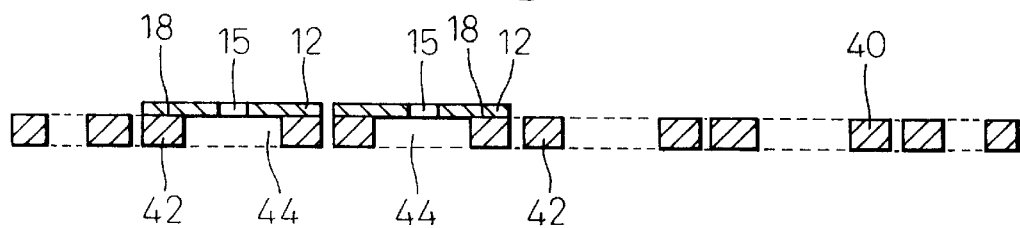
FIG. 4 is a side sectional view of individual film substrates adhered to the reinforcement frame through P–P' of FIG. 3.

FIG. 4 is a side sectional view taken along line P–P' in FIG. 3. The reinforcement members 42, each having the accommodation hole 44 for accommodating the semiconductor chip 10, are consecutively aligned at a pitch. On one side of the reinforcement member 42 is adhered the individual film substrate 12. The opening 15 is provided in a widthwise central region of the film substrate 12 adhered to the reinforcement member 42. Bonding sections 22 of the circuit patterns are disposed along edges of the opening 15, while lands 16a are formed outside of the bonding sections 22, to be connected to external connection terminals.

After the film substrate 12 has been adhered to the respective reinforcement member 42, the semiconductor chip 10 is bonded to the film substrate 12 while being accommodated within the accommodation hole 44.

Figure 5:
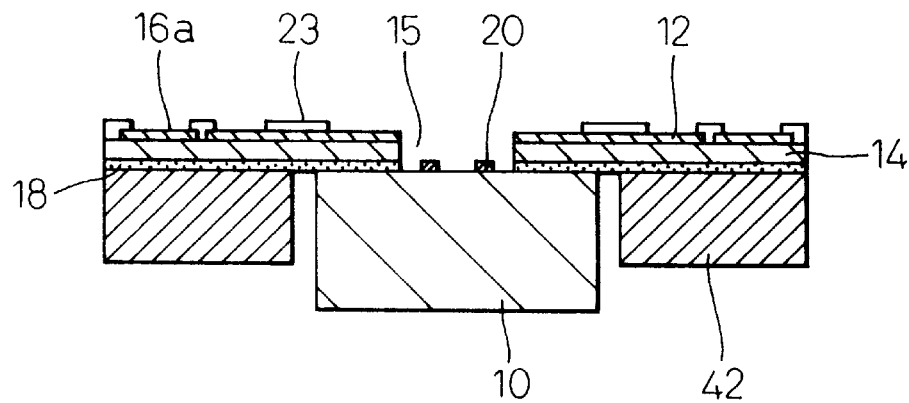
FIG. 5 is a side sectional view of a semiconductor chip mounted onto the film substrate.

FIG. 5 is a side sectional view of the film substrate 12 carrying the semiconductor chip 10 thereon. The semiconductor chip 10 is supported by the film substrate 12 while being adhered thereto via the adhesive layer 18 provided on the bottom surface of the film substrate 12. Although only one reinforcement member 42 in the reinforcement frame 40 is illustrated in this drawing to clarify the explanation, the semiconductor chips 10 are sequentially adhered to all the reinforcement members 42 of the reinforcement frame 40. Reference numeral 23 denotes a protective film, for example, of solder resist.

Figure 6:
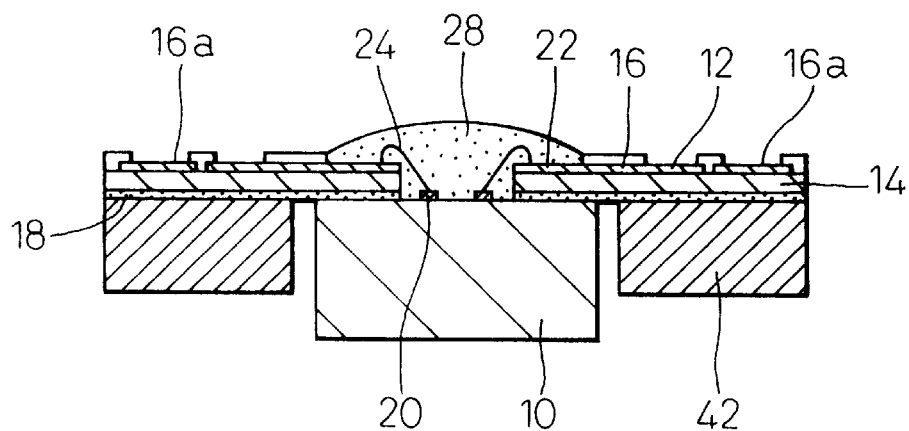
FIG. 6 is a side sectional view of the semiconductor chip mounted onto the film substrate and resin-shielded thereto.

After the semiconductor chip 10 has been mounted, the electrode terminals 20 of the semiconductor chip 10 are wire-bonded to the bonding parts 22 of the film substrate 12, and the electrode terminals 20, the bonding parts 22 and the bonding wires 24 are shielded with resin, as shown in FIG. 6.

Figure 7:
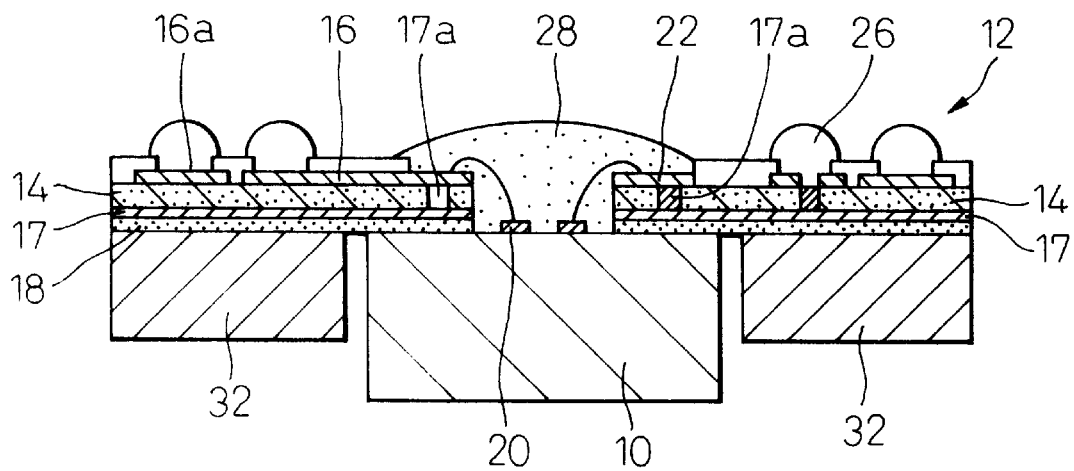
FIG. 7 is a side sectional view of a semiconductor device formed by using a film substrate provided on opposite sides thereof with conductive layers.

Finally, external connecting terminal, such as solder balls, are attached to the land portions 16a, as shown in FIG. 7.

Figure 14A:
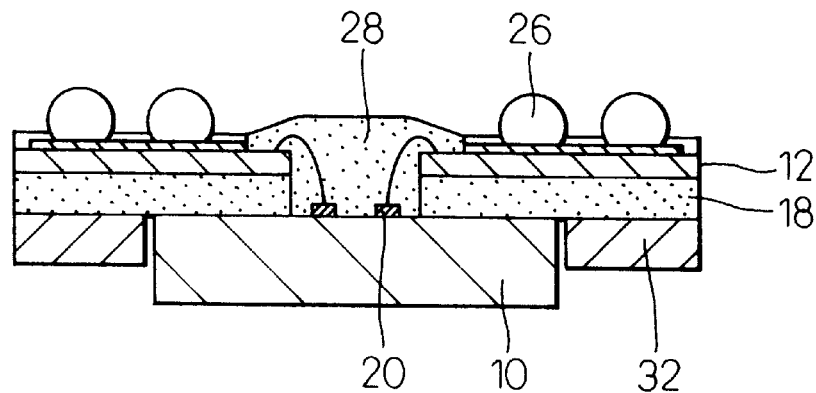
FIGS. 14(a) and 14(b) are a side sectional view and a bottom view of a semiconductor device, respectively, wherein a film substrate is strengthened by a reinforcement member.
Figure 14B:
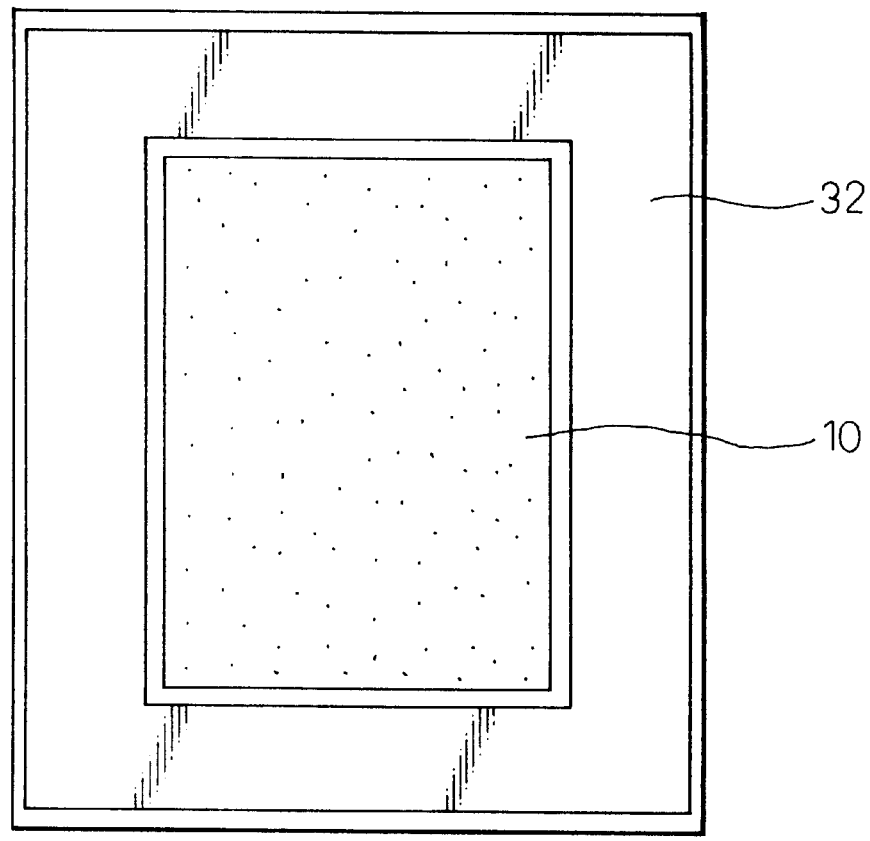

Thus, the semiconductor devices are formed in every section of the reinforcement frame 40, and are divided into single units by separating the respective reinforcement members 42 in the respective sections from each other. The resultant semiconductor device has the same structure as that shown in FIG. 14.

Since the film substrate 12 in the outer peripheral region of the semiconductor chip 10 is supported by the reinforcement member 42 formed in the reinforcement frame 40 according to the process of this embodiment, the manufacturing of the semiconductor device is enhanced if reinforcement frame 40 is used, which has functions both for a carrier frame and a reinforcement member 32.

The manufacturing process according to the present invention eliminates a carrier frame exclusively used for supporting and transporting the film substrate tape 122 along the manufacturing line, whereby the manufacturing process is simplified and waste is reduced to effectively lower the manufacturing cost.

The film substrate tape 122 may be designed solely to transfer the individual film substrates 12 to the reinforcement frame 40. If the film substrate tape is designed to obtain as large a number as possible of the film substrates 12, material for forming a base film such as polyimide could be effectively saved to efficiently produce the film substrate 12.

Since a metallic material such as stainless steel, which is less expensive than resinous material, could be used for forming the reinforcement frame 40, it is possible to lower the manufacturing cost while maintaining a sufficient strength for a carrier frame as well as enhancing the transportation workability.

In this regard, a resinous material may be used for forming the reinforcement frame 40. If the same resinous material as that used for forming the film substrate 12 is employed, coefficients of thermal expansion of the film substrate 12 and the reinforcement member 32 are equal to each other to improve the reliability of the resultant semiconductor device. If heat-resistant resinous material is used, a thermally reliable semiconductor device is obtainable.

FIGS. 7 and 8 illustrate other embodiments of a semiconductor device produced by a process similar to the above-mentioned process for manufacturing a semiconductor device.

In a semiconductor device shown in FIG. 7, a film substrate 12 is used, which is provided on one side of a base film 14 with circuit patterns 16 and on the other side with a conductor layer 17 used as a ground layer or a power source layer. A reinforcement member 32 and a semiconductor chip 10 are bonded via an adhesive layer 18 to the film substrate 12. Reference numeral 16a denotes a land, and 22 denotes a bonding part. The electrical connection between the circuit patterns 16 including the land 16a or the bonding part 22 and the conductor layer 17 is made by a via 17a pierced through the base film 14.

The bonding part 22 and the land 16a may be independently formed and connected respectively to the conductor layer 17 by the respective vias 17a. Or the circuit pattern 16 electrically connecting the bonding part 22 and the land 16a may be formed and then suitable positions of the circuit pattern 16 may be connected by the vias 17a to the conductor layer 17.

After the film substrate 12 is bonded to a reinforcement frame 40 and the semiconductor chip 10 is adhered thereto, an electrode terminal 20 is wire-bonded to the bonding part 22, and the electrode terminal 20 and the bonding part 22 are shielded with resin, after which external connection terminals 26 are bonded to the lands 16a. Finally, the semiconductor device shown in FIG. 7 is individually separated from the reinforcement frame 40.

Figure 8A:
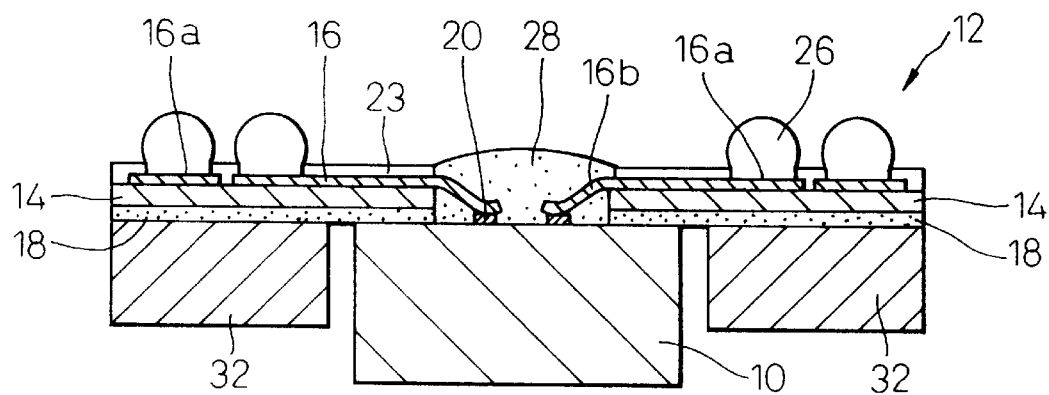
FIGS. 8(a) and 8(b) are side sectional views, respectively, of semiconductor devices, each being formed by using a film substrate wherein a lead section is formed at a distal end of a circuit pattern.
Figure 8B:
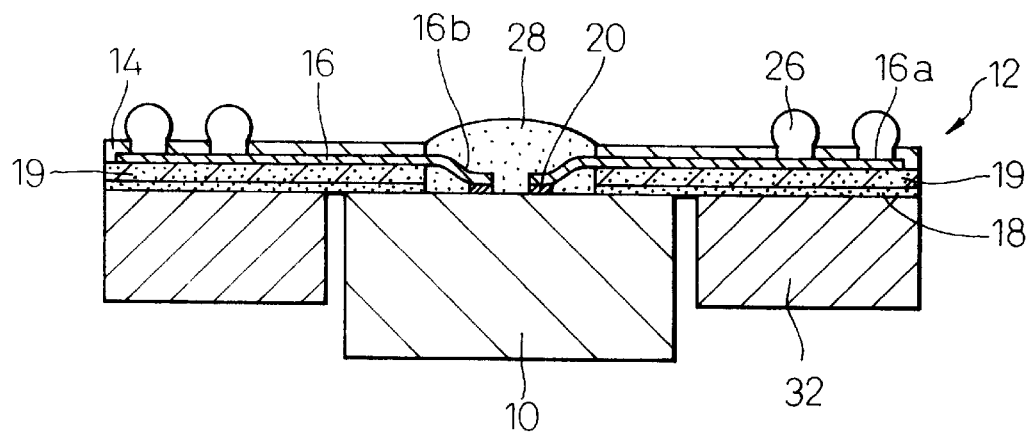

In a semiconductor device shown in FIG. 8, a film substrate 12 is used, having a base film 14 with an opening at a position corresponding to an area in which electrode terminals 20 of a semiconductor chip 10 are provided. Leads 16b of circuit patterns 16 extend into the opening. A reinforcement member 32 and the semiconductor chip 10 are bonded to the film substrate 12 via an adhesive layer 18. In FIG. 8(a), the film substrate 12 is provided on the outer surface of the base film 14 with circuit patterns 16. The semiconductor chip 10 is adhered to the base film 14 with the adhesive layer 18. In FIG. 8(b), the film substrate 12 is provided on the inner surface of the base film 14 with circuit patterns 16. A semiconductor chip 10 and a reinforcement member 32 are adhered via an adhesive layer 18 to a shock-absorbing layer 19 covering the inner surface of the base film 14. In this regard, the embodiment shown in FIG. 8(b) may be modified so that the shock-absorbing layer 19 is eliminated and the semiconductor chip 10 and the reinforcement member 32 are adhered to the film substrate 12 via an electrically-insulating adhesive layer 18.

The leads 16b are arranged to be aligned with the electrode terminals 20, and each of the leads 16b may be wire-bonded and electrically connected to the respective electrode terminal 20 by bending a tip end thereof toward an electrode terminal-forming surface of the semiconductor chip 10 with a bonding tool.

After the film substrate 12 has been adhered to the reinforcement frame 40 and the semiconductor chip 10 has been bonded, the leads 16b are adhered to the electrode terminals 20 as described above, the electrode terminals 20 and the leads 16b are shielded with resin, and external connection terminals 26 are bonded to the lands 16a. Finally, individual semiconductors are separated from the reinforcement frame 40 to result in the semiconductor devices shown in FIGS. 8(a) and 8(b).

Figure 9:
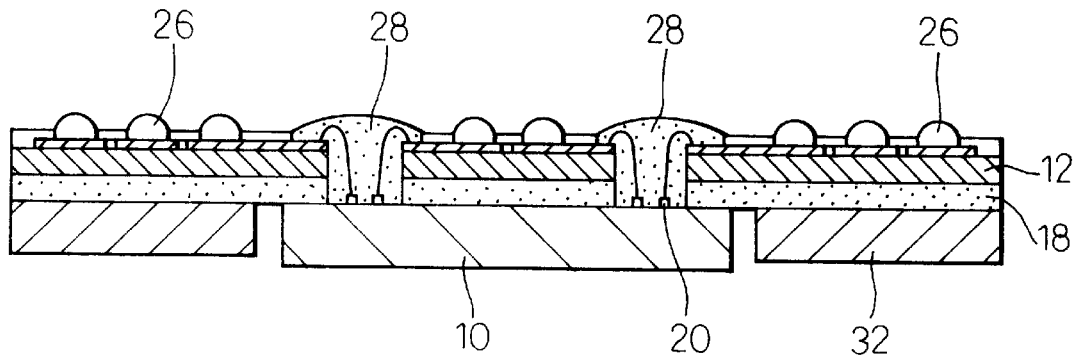
FIG. 9 is a side sectional view of a semiconductor device wherein a semiconductor chip is mounted onto a film substrate by the wire-bonding carried out in the outer peripheral region of an electrode terminal-forming surface thereof.

While the semiconductor chip 10 used in the semiconductor device according to the above-mentioned embodiments has electrode terminals 20 arranged in a central region of the electrode terminal-forming surface, a semiconductor chip 10 used in an embodiment shown in FIG. 9 has electrode terminals 20 arranged in the peripheral region of the electrode terminal-forming surface. The electrode terminals 20 are electrically connected to circuit patterns of a film substrate 12 in the peripheral region of the semiconductor chip 10 by a wire bonding, and the electrode terminals 12, bonding wires and bonding sections are shielded with shielding resin 28. Such a semiconductor device may also be produced in a similar manner as described above wherein a film substrate tape 122 and a reinforcement frame 40 are prepared in shape in conformity with a semiconductor chip 10, and the reinforcement frame 40 is used as a carrier frame.

Figure 10:
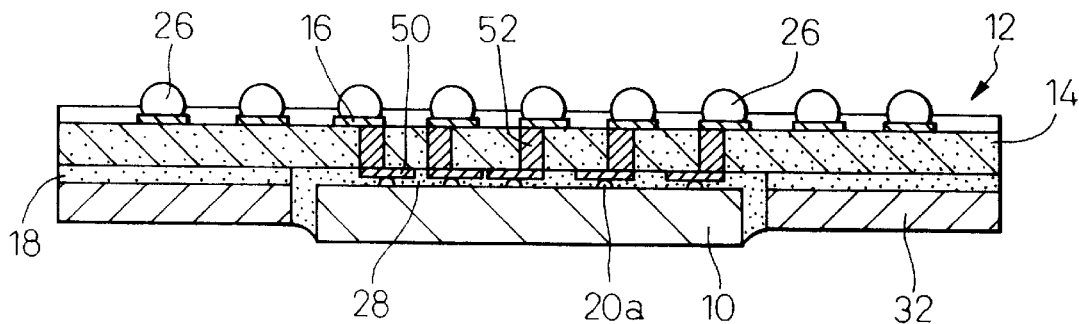
FIG. 10 is a side sectional view of a semiconductor device wherein a semiconductor chip is mounted onto a film substrate by a flip-chip bonding.
Figure 11:
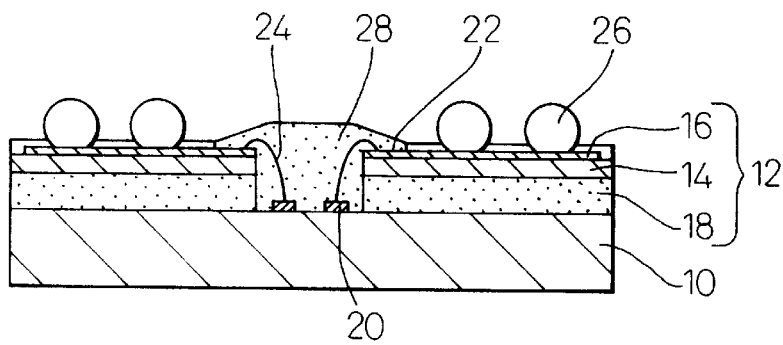
FIG. 11 is a side sectional view of a prior art semiconductor device wherein a film substrate is adhered to an electrode terminal-forming surface.
Figure 12:
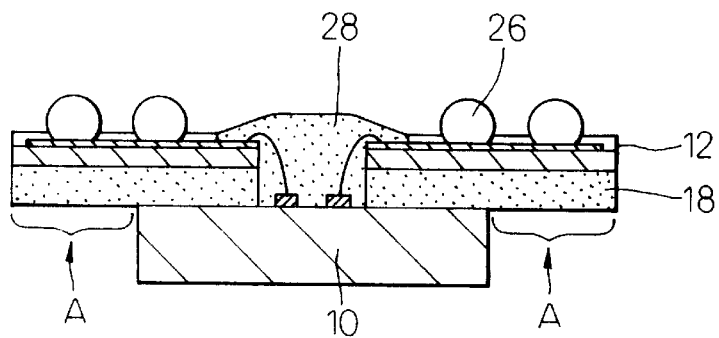
FIG. 12 is a side sectional view of a semiconductor device mounting onto a film substrate a semiconductor chip having a smaller outer dimension than that of the film substrate.
Figure 13A:
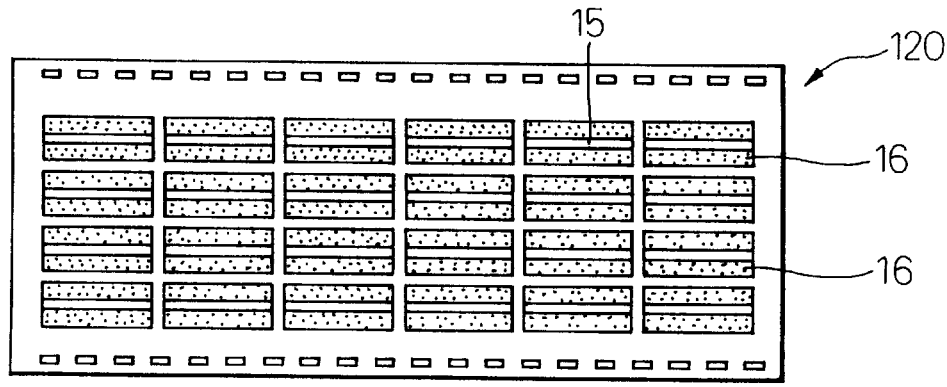
FIGS. 13(a) to 13(c) illustrate the prior art steps for manufacturing a semiconductor device, respectively.
Figure 13B:
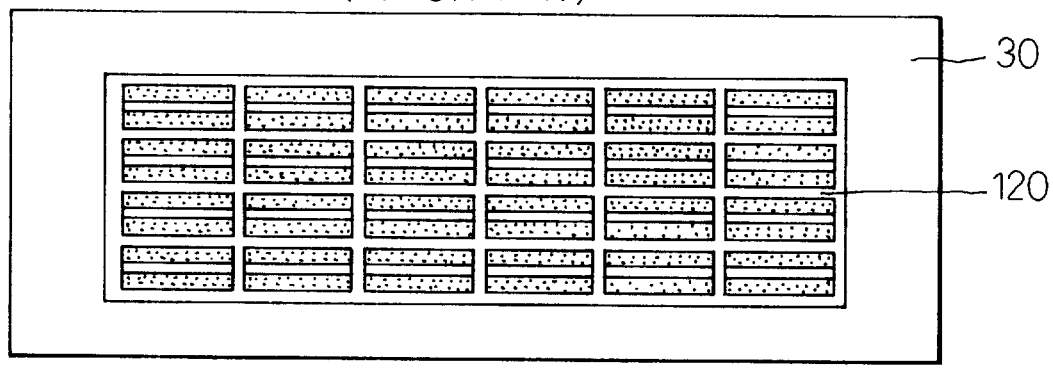
Figure 13C:
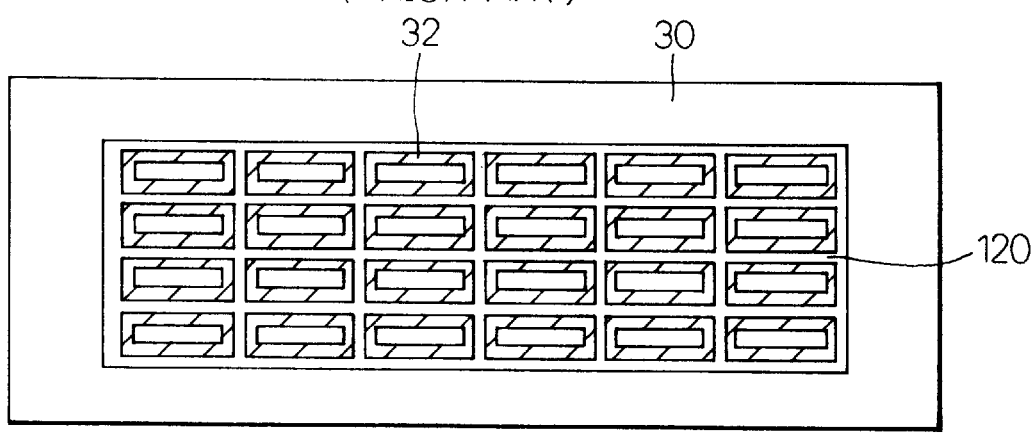

FIG. 10 illustrates a further embodiment of a semiconductor device wherein a semiconductor chip 10 is mounted to a film substrate 12 by a flip-chip bonding. On one surface of a base film 14 of the film substrate 12 are provided circuit patterns 16, while on the other surface thereof defining a mounting surface for the semiconductor chip 10 are provided connection terminals 50 to be bonded to connector bumps 20a formed on a electrode terminal-forming surface of the semiconductor chip 10. The connection terminal 50 and the circuit pattern 16 are electrically connected to each other with conductive vias 52 provided by penetrating the base film 14 in the thickness direction. Reference numeral 32 denotes a reinforcement member for supporting the film substrate 12 in the outer peripheral region of the semiconductor chip 10.

According to this embodiment, the film substrate 12 cut off from the film substrate tape 122 is adhered to a reinforcement frame 40, and the semiconductor chip 10 is bonded to the film substrate 12 while aligning the connection terminals 50 of the film substrate 12 with the bumps 20a. After the semiconductor chip 10 has been mounted, the electrode terminal-forming surface of the semiconductor chip 10 is shielded with shield resin 28 by a potting method.

Finally, external connection terminals 26 are bonded to lands provided in the circuit patterns 16, and the reinforcement members 32 are cut off from the reinforcement frame 40 to result in individual semiconductor devices.

In this respect, according to these embodiments described above, external connection terminals such as solder balls may be bonded after the reinforcement members 32 have been cut off and the individual semiconductor devices have been obtained. Or, if the connection terminals are already provided on a circuit board on which the semiconductor device is to be mounted, the external connection terminals may be eliminated.

According to a process for manufacturing a semiconductor device of the present invention, as described above, a film substrate is adhered onto an electrode terminal-forming surface of a semiconductor chip and is reinforced with an reinforce member, whereby the process for manufacturing the semiconductor device can be simplified to effectively reduce the manufacturing cost. Also, by using a metallic frame as a reinforcement frame, the workability is improved to result in a reliable semiconductor device.

What is claimed is:

1. A process for manufacturing a semiconductor device, said process comprising:

separating individual film substrates from a film substrate tape having a plurality of said film substrates continuously and integrally connected to each other, each said film substrate comprising a base film having first and second surfaces, a circuit pattern being formed on said first surface and a semiconductor element mounting section being formed on said second surface, said base film having an opening to which electrode terminals of a semiconductor element are exposed when said semiconductor element is mounted;

adhering said individual film substrates to respective reinforcement members of a reinforcement frame having a plurality of said reinforcement members continuously and integrally connected to each other, each said reinforcement member having an accommodation hole to accommodate said semiconductor element, so that said semiconductor element mounting section is exposed in said accommodation hole, said opening is communicated with said accommodation hole, and a cavity to mount said semiconductor element is defined by a wall of said accommodation hole and said semiconductor mounting section;

mounting said semiconductor element on said film substrate by adhering an electrode terminal forming surface of the semiconductor element to said mounting section so that electrode terminals of the semiconductor element are exposed in said opening;

electrically connecting said electrode terminals exposed in said opening to said circuit patterns;

sealing said opening with resin; and separating said individual reinforcement members from said reinforcement frame.

2. A process as set forth in claim 1, wherein said electrode terminals of the semiconductor element are electrically connected to said circuit patterns by wire-bonding.

3. A process as set forth in claim 1, wherein said film substrate is such that tip ends of said circuit pattern extend into said opening as lead portions.

4. A process as set forth in claim 1, wherein said reinforcement frame comprises a frame base and said plurality of reinforcement members suspended by said frame base.

5. A process as set forth in claim 1, wherein said reinforcement frame is a metallic reinforcement frame.

6. A process for manufacturing a semiconductor device, said process comprising:

separating individual film substrates from a film substrate tape having a plurality of said film substrates continuously and integrally connected to each other, each said film substrate comprising a base film having first and second surfaces, a circuit pattern being formed on said first surface and a mounting section being formed on said second surface, said mounting section provided with connecting terminals connected to said circuit patterns by means of vias;

adhering said individual film substrates to respective reinforcement members of a reinforcement frame having a plurality of said reinforcement members continuously and integrally connected to each other, each said reinforcement member having an accommodation hole to accommodate a semiconductor element, so that said mounting section and said connecting terminals are exposed in said accommodation hole and a cavity to mount a semiconductor element is defined by a wall of said accommodation hole and said mounting section;

mounting said semiconductor element on said film substrate by flip-chip electrically connecting said electrode terminals of the semiconductor element to said connecting terminals; and separating said individual reinforcement members from said reinforcement frame.

7. A process as set forth in claim 6, further comprises a step of:

sealing said accommodation hole with resin after said semiconductor element is mounted on said film substrate.

8. A process as set forth in claim 6, wherein said reinforcement frame comprises a frame base and said plurality of reinforcement members suspended by said frame base.

9. A process as set forth in claim 6, wherein said reinforcement frame is a metallic reinforcement frame.

10. A process of manufacturing a plurality of semiconductor devices, said process comprising:

adhering film substrates to respective reinforcement members of a reinforcement frame comprising a plurality of said reinforcement members;

mounting semiconductor elements of the semiconductor devices to respective ones of said film substrates; and separating said reinforcement members from said reinforcement frame.

11. The process as set forth in claim 10, wherein said semiconductor devices comprise said reinforcement members.

* * * * *